United States Patent
Rhodes (10) Patent No.: US 7,391,066 B2
(45) Date of Patent: Jun. 24, 2008

(54) IMAGER FLOATING DIFFUSION REGION AND PROCESS FOR FORMING SAME

(75) Inventor: Howard Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 487 days.

(21) Appl. No.: 10/422,965

(22) Filed: Apr. 25, 2003

(65) Prior Publication Data

US 2005/0023580 A1 Feb. 3, 2005

(51) Int. Cl.
*H01L 31/062* (2006.01)
(52) U.S. Cl. .......................... 257/239; 257/291; 257/292
(58) Field of Classification Search ................. 257/239, 257/291, 292
See application file for complete search history.

(56) References Cited

U.S. PATENT DOCUMENTS

| | | | | |
|---|---|---|---|---|
| 5,191,398 A | * | 3/1993 | Mutoh | 257/216 |
| 5,710,446 A | * | 1/1998 | Chi et al. | 257/225 |
| 6,110,789 A | * | 8/2000 | Rhodes et al. | 438/305 |
| 6,291,280 B1 | * | 9/2001 | Rhodes | 438/199 |
| 6,326,652 B1 | * | 12/2001 | Rhodes | 257/231 |
| 6,326,655 B1 | * | 12/2001 | Suzuki | 257/239 |
| 6,407,440 B1 | * | 6/2002 | Rhodes | 257/462 |
| 6,534,335 B1 | * | 3/2003 | Rhodes et al. | 438/60 |
| 6,639,261 B2 | * | 10/2003 | Rhodes | 257/291 |
| 6,818,930 B2 | * | 11/2004 | Mouli et al. | 257/215 |
| 6,878,568 B1 | * | 4/2005 | Rhodes et al. | 438/73 |

* cited by examiner

*Primary Examiner*—Hung Vu
(74) *Attorney, Agent, or Firm*—Dickstein Shapiro LLP (57) ABSTRACT

The present invention provides an imager device with a floating diffusion region resistant to charge leakage. The floating diffusion region is formed having a first doped region and a second doped region which has a higher concentration of dopants than the first doped region. The floating diffusion region is resistant to charge leakage while maintaining good contact to a conductor connected to a gate of a source follower transistor.

46 Claims, 5 Drawing Sheets

*FIG. 1*

PRIOR ART

IMAGER FLOATING DIFFUSION REGION AND PROCESS FOR FORMING SAME

FIELD OF THE INVENTION

The present invention relates generally to the field of semiconductor devices and more particularly, to an imager device with a floating diffusion region resistant to charge leakage.

BACKGROUND OF INVENTION

The semiconductor industry currently uses different types of semiconductor-based imagers including charge-coupled devices (CCD, as used herein throughout) and complementary metal oxide semiconductor (CMOS, as used herein throughout) imager devices. Because of the inherent limitations in CCD technology, CMOS imagers have been increasingly used as low cost imaging devices. A fully compatible CMOS sensor technology enabling a higher level of integration of an image array with associated processing circuits is beneficial for many digital applications such as, for example, cameras, scanners, machine vision systems, vehicle navigation systems, video telephones, computer input devices, surveillance systems, auto focus systems, and others.

A CMOS image sensor circuit includes a focal plane array of pixel cells, each one of the cells including a photoconversion device, for example, a photogate, photoconductor, or a photodiode for accumulating photogenerated charge in a doped portion of the substrate. A readout circuit is connected to each pixel cell and includes at least an output transistor, which receives photogenerated charges typically from a doped floating diffusion region and produces an output signal which is periodically read-out through a row select access transistor. The imager may optionally include a transistor for transferring charge from the photoconversion device to the floating diffusion region or the floating diffusion region may be directly connected to or part of the photoconversion device. A transistor is also typically provided for resetting the diffusion region to a predetermined charge level before it receives the photoconverted charges.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing are hereby incorporated by reference herein in their entirety.

A known three-transistor (3T) CMOS active pixel sensor (APS) design used in many applications contains a photodiode for producing charges which are stored at a diffusion region, a reset transistor for resetting the diffusion region charge, a source follower transistor having a gate connected to the diffusion region for producing an output signal, and a row select transistor for selectively connecting the source follower transistor to a column line of a pixel array. In a four-transistor (4T) CMOS configuration, a transfer transistor is employed to gate charges from the photodiode to the diffusion region.

Conventional floating diffusion regions in 3T and 4T pixel designs typically have a n+ highly-doped region to facilitate charge flow. In addition, these highly-doped n+ floating diffusion regions serve to provide a low resistance ohmic metal-semiconductor contact for charge transfer to the source follower transistor. However, these same highly-doped n+ regions create current leakage into the substrate due to high electric fields caused by the junction with a p-type region in which the n+ region is formed.

Figure 1:
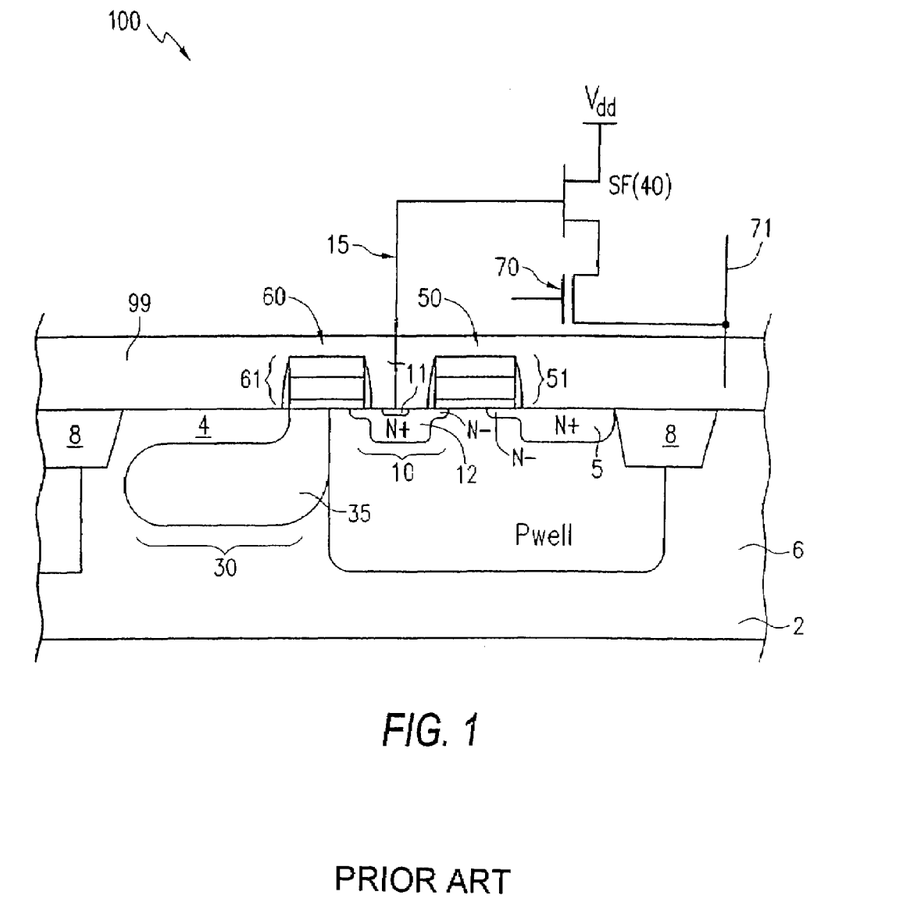
FIG. 1 is a diagrammatic side sectional view of a CMOS image sensor pixel.

FIG. 1 illustrates a diagrammatic side sectional view of a CMOS image sensor four-transistor (4T) pixel employing a n+ highly-doped floating diffusion region 10.

The CMOS image sensor pixel 100 generally comprises a charge collection region 35 of a photodiode for collecting charges generated by light incident on the pixel and transfer transistor having a gate 60 for transferring photoelectric charges from the collection region 35 to a sensing node, typically a floating diffusion region 10. The floating diffusion region 10 is electrically connected to the gate of an output source follower transistor 40. The pixel 100 also includes a reset transistor having a gate 50 for resetting the floating diffusion region 10 to a predetermined voltage before charge is transferred thereto from the photodiode, the source follower transistor 40 which receives at its gate an electrical signal from the floating diffusion region 10, and a row select transistor 70 for selectively outputting a signal from the source follower transistor 40 to a column line 71 in response to a decoded row address driver signal applied to the gate of the transistor 70.

The exemplary pixel 100 of FIG. 1 employs a pinned photodiode having charge collection region 35. The pinned photodiode is termed such since the potential in the photodiode is pinned to a constant value when the photodiode is fully depleted. The pinned photodiode has a photosensitive p-n junction region comprising a p-type surface layer 4 and a n-type photodiode region 35 within a p-type region 6. The two p-type regions 4, 6 cause the n-type photodiode region 35 to be fully depleted at a pinning voltage. Impurity doped source/drain regions, preferably having n-type conductivity, are provided about the transistor gates 50 and 60. The floating diffusion region 10 adjacent to transfer gates 51, 61 is a common source/drain region for a transfer transistor having gate 60 and the reset transistor having gate 50.

Conventionally, in forming the source/drain region for the transfer transistor having gate 60 and the reset transistor having gate 50, floating diffusion region 10 is formed by implanting dopants near the transfer and reset transistors and allowing the diffusion regions from each transistor to combine, e.g., to flow inwards toward each other, to ultimately form floating diffusion region 10.

Further, in a typical CMOS image sensor, trench isolation regions 8 formed in a p– region active layer 6 are used to isolate the pixels. The gate stacks for the pixel transistors are formed before or after the trench is etched. The order of these preliminary process steps may be varied as is required or convenient for a particular process flow.

A translucent or transparent insulating layer 99 is typically formed over the pixel 100. Conventional processing methods are then carried out to form, for example, metal conductor 15 in the insulating layer to provide an electrical connection/contact to the floating diffusion region 10, and other wiring to connect gate lines and other connections in pixel 100. For example, the entire substrate surface may be covered with a passivation layer of e.g., silicon dioxide, BSG, PSG, or BPSG, which is planarized and etched to provide contact holes, which are then metallized to provide contacts to a photogate (if used in place of a photodiode), and diffusion node 10.

In conventional CMOS image sensors, electrons are generated by light incident externally and accumulates in the n-type photodiode region 35. These charges are transferred to the floating diffusion region 10 by the gate 60 of the transfer transistor. The source follower transistor 40 produces an output signal from the transferred charges. A maximum output signal is proportional to the number of electrons extracted from the n-type photodiode region 35. The maximum output signal increases with increased electron capacitance or acceptability of the photodiode 35. The electron capacity of pinned photodiodes typically depends on doping levels and the dopants implanted to form regions 4, 6, and 35.

Floating diffusion region 10 can lose some of the transferred charge across the p-n junction. Such current leakage lowers the available pixel output signal transmitted to the gate of source follower transistor 40. Typically, the floating diffusion region 10 includes a lightly-doped drain (LDD) n- region at areas extending slightly beneath the gates 50 and 60 and a heavily doped n+ region between the gates 50 and 60.

While the highly-doped n+ floating diffusion region 10 provides good charge transfer characteristics and a good ohmic contact to metal conductor 15, the highly-doped n+ floating diffusion region 10 also produces charge leakage into the p-type region 6 which diminishes the collected light signal that is transferred to the gate of the source follower transistor 40.

A floating diffusion region which is resistant to junction leakage and can still provide a good contact with metal conductor 15 is desired.

BRIEF SUMMARY OF THE INVENTION

The present invention provides a CMOS imager with a floating diffusion region that is resistant to charge leakage. The floating diffusion region is formed of a low dose n– dopant implant and makes it resistant to current leakage to the substrate. To maintain good contact with a metal conductor, the floating diffusion region also includes a low phosphorus implant where contact to the metal conductor will occur. As a result, the floating diffusion region is resistant to charge leakage while maintaining good contact to the conductor of the source follower transistor.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. Additionally, processing steps described and their progression are exemplary of preferred embodiments of the invention; however, the sequence of steps is not limited to that set forth herein and may be changed as is known in the art, with the exception of steps necessarily occurring in a certain order.

The term "substrate" used in the following description may include any supporting structure including, but not limited to, a semiconductor substrate that has an exposed substrate surface. Semiconductor "substrates" and "wafer" are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Further, when reference is made to a "substrate" or "wafer" in the following description, previous process steps may have been utilized to form regions, junctions, or material layers in or over the base semiconductor or foundation. In addition, the semiconductor need not be silicon-based, but could be based on other semiconductors such as silicon-germanium, germanium, or gallium arsenide, among others.

The term "pixel" refers to a photo-element unit cell containing a photoconversion device for converting electromagnetic radiation to an electrical signal and transistors which operate the pixel. For purposes of illustration, representative pixel embodiments are illustrated in the figures and described herein, and typically fabrication of all pixels in an imager will proceed simultaneously in a similar fashion. Other embodiments of pixels which employ the inventions may also be produced.

It should be appreciated that although the following description describes the formation of a CMOS imager. The methods and structures of the present invention can be utilized with equal effectiveness in a CCD Imager when a floating diffusion region that is resistant to charge leakage is desired.

The invention will now be explained with reference to FIGS. 2-5 which illustrate exemplary embodiments of a semiconductor device with a floating diffusion region constructed in accordance with the invention. The floating diffusion region is also known in the art as a sensing node, floating diffusion node, and a diffusion node, among others. For purposes of a simplified description, the description utilizes the term floating diffusion region. It should also be understood that similar reference numbers correspond to similar elements for FIGS. 2-5.

Referring first to the n+ region 10 of the 4T pixel of FIG. 1, it is normally formed from a n-type LDD implant followed by a highly-doped n+ source and drain implant. Typically, this highly-doped n+ region is formed using a n-type dose of $5 \times 10^{14}/cm^2$ to about $3 \times 10^{16}/cm^3$. Further, the n-type LDD implant is normally conducted very close to the reset and transfer transistors. Then, a second mask is used and the source/drain of the reset and transfer transistors are formed. The resulting n+ floating diffusion region 10, illustrated in FIG. 1, is formed as a result of the two diffusion regions combining from the LDD implant step and the highly n+ doping source/drain implant step.

Figure 2:
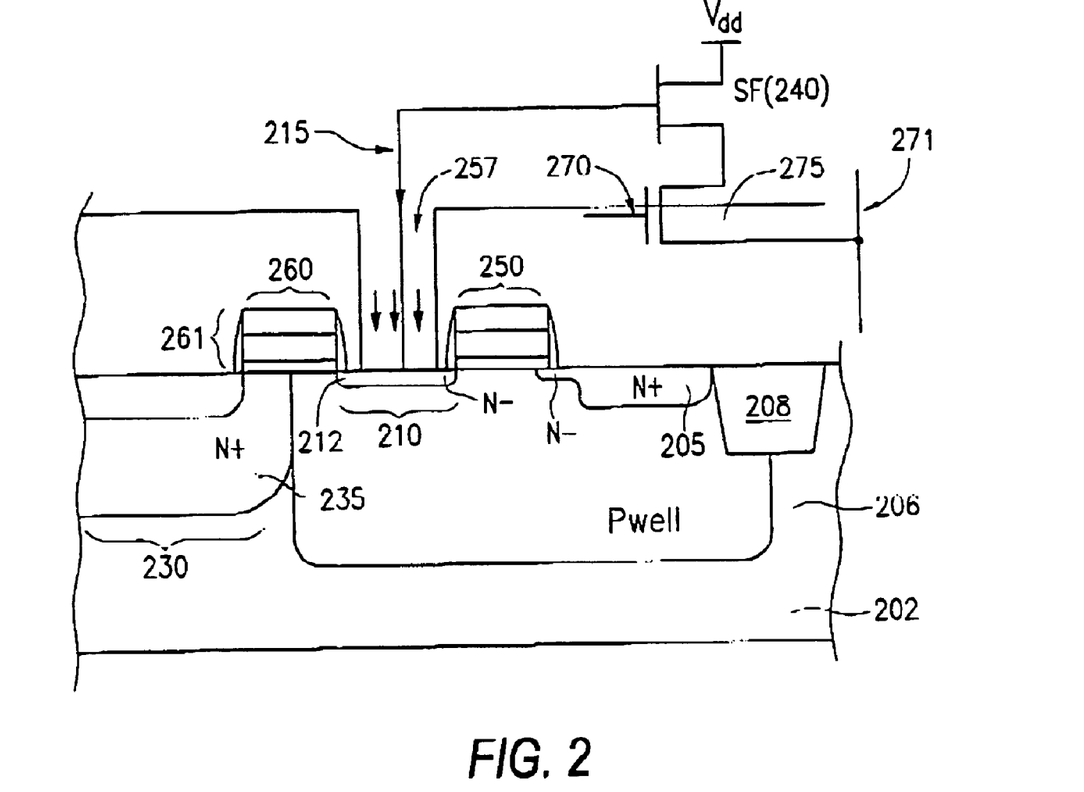
FIG. 2 is a diagrammatic side sectional view of a CMOS image sensor pixel formed in accordance with a first embodiment of the present invention.

Referring now to FIG. 2, in one exemplary embodiment, the present invention provides a floating diffusion region 210 with a n-type implantation dose within the range from about $1 \times 10^{12}/cm^2$ to about $2 \times 10^{14}/cm^2$ such that a n– region is formed as the source and drain region between a transfer transistor gate 260 and a reset transistor gate 250. Rather than providing a LDD implant first near the transistors, and then a highly n+ doped source/drain region that diffuses together to form a floating diffusion region, the present invention provides the source/drain region first, by implanting dopant between the transistors 260, 250 and allowing the dopant to diffuse outwards toward the transistors; thus, forming a common source/drain. Further, the common source/drain region is not a highly n+ doped region. Moreover, the n− dopant levels for floating diffusion region 210 may be at the same doping levels as the conventional LDD doping for the transfer 260 and reset transistor 250 source and drain regions, as well as for LDD regions of other transistors, for example, a source follower 240 and row select transistor 270 used in conjunction with the illustrated pixel.

Figure 3:
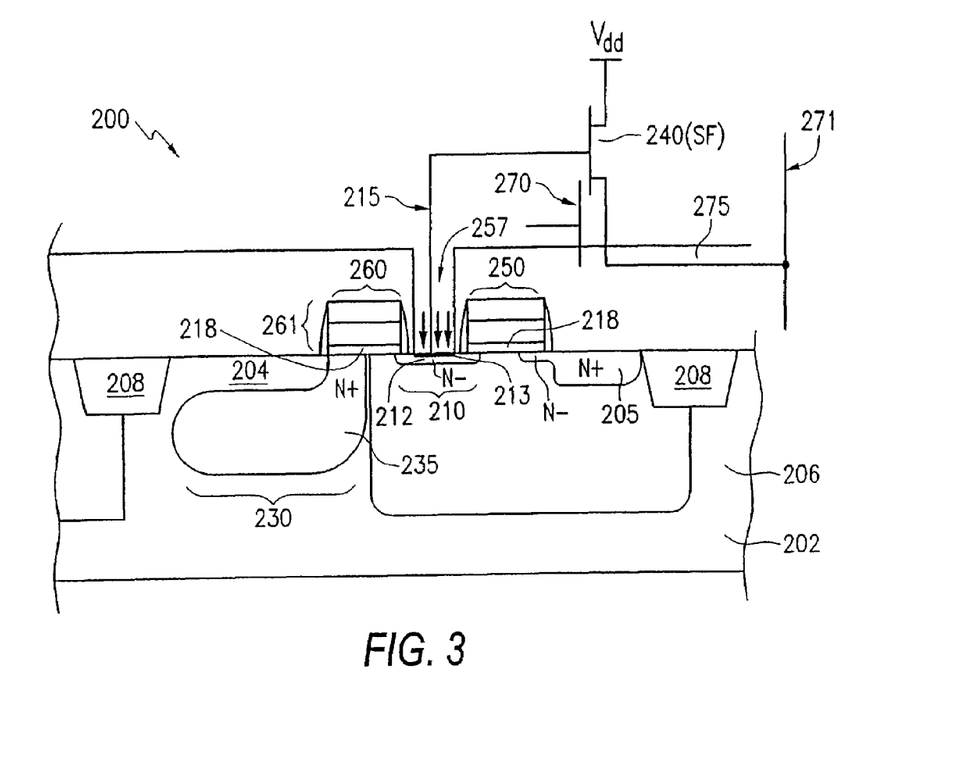
FIG. 3 is a diagrammatic side sectional view of a CMOS image sensor pixel and FIG. 2 at a subsequent processing step.

Referring now to FIG. 3, in order to maintain good contact with a metal conductor, an upper portion 213 of the floating diffusion region 210 is further doped to a slightly higher n− doping concentration using a dose within the range from about $4 \times 10^{12}/cm^2$ to about $1 \times 10^{14}/cm^2$. The upper portion 213 is implanted with an implant energy from about 1 KeV to about 80 KeV, and preferably with an implant energy from about 4 KeV to about 50 KeV.

Thus, a first n− impurity concentration is formed in the body of the floating diffusion region 210. A second impurity concentration is added to the first impurity concentration forming a more heavily-doped upper portion 213 of floating diffusion region 210. Region 213 is in direct contact with a metal conductor 215 and with the first impurity concentration doped n− region 212. As a result, a two-doped level 212, 213 floating diffusion region 210 is provided that is resistant to charge leakage, while providing good contact to the conductor 215 connected to the gate of the source follower transistor 240.

As a result, the region 212 of the floating diffusion region 210 has substantially the same doping level as a lightly-doped drain (LDD) n− region which is used for the reset transistor 250 and transfer transistor 260 (if provided) of the pixel 200, and of the source follower 240 and row select 270 transistor. The n-type ions used for doping region 210 may comprise phosphorus (P), arsenic (As), or antimony (Sb), and other n-type ion dopants known in the art when the pixel transistors are n− channel devices.

The formation of the lightly-doped n− floating diffusion region 212 can occur at the same time as LDD regions are formed for other transistors, e.g., the reset and other transistors of the pixel, or at another time. Further, the formation of the lightly-doped n− floating diffusion region occurs by implanting the first impurity concentration between the transfer 260 and reset 250 transistors with an appropriate mask. Region 212 then diffuses outward towards the reset 250 and transfer 260 transistors forming a commonly-shared source/drain. After region 212 diffuses outwards and forms the source/drain regions of the reset 250 and transfer 260 transistors, a second impurity concentration is provided.

In one preferred embodiment, the additional n-type implant to form shallow contact region 213 may be conducted as a directed or blanket phosphorus implant after the contact holes, such as contact hole 257, are patterned and etched. The phosphorus implant into the lightly-doped n− region 212, can be conducted as a shallow PHOS ion implant step to form an n-type shallow contact region 213 which is more heavily-doped than the n− region 212, but not as heavily-doped as the n+ source and drain region 205 of the reset transistor 250 or of the transfer 260 (if used), source follower 240, and row select transistor 270 associated with a pixel. Although phosphorus is one n-type dopant which can be used to form region 213, other n-type dopants may also be used.

After doping of region 212 is performed, the doping of shallow contact region 213 may occur as part of the process of doping the source/drain regions of the various transistors to be fabricated on a substrate, or after all transistor doping is completed. For example, referring again to FIGS. 2 and 3, the light n− doping of floating diffusion region 210 may occur by the masking and doping of the substrate for the LDD transistor implant, after which all other transistor doping steps are completed.

Figure 3A:
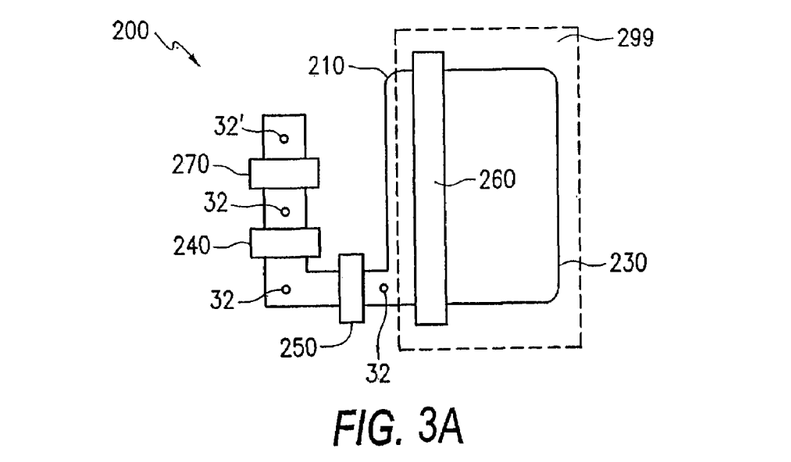
FIG. 3A is a top plan view of an exemplary CMOS image sensor pixel with a LDD block mask.

Further, FIG. 3A illustrates a different view of pixel cell 200 of FIGS. 2 and 3. A schematic top view of a semiconductor wafer fragment of an exemplary CMOS sensor pixel 4T cell 200 is illustrated in FIG. 3A. The CMOS sensor pixel cell 200 includes a photogenerated charge collection region 230, in a doped portion of the substrate, for collecting charges generated by light incident on the pixel cell 200. This region 230 is formed as a pinned photodiode. The photodiode is termed "pinned" because the potential in the photodiode is pinned to a constant value when the photodiode is fully depleted. It should be understood, however, that the CMOS sensor pixel cell 200 may include a photogate or other photon to charge converting device, in lieu of a pinned photodiode, as the initial collection region 230 for photogenerated charge.

The CMOS image sensor 200 of FIG. 3A has a transfer transistor with gate 260 for transferring photoelectric charges from the charge collection region 230 to a sensing node 210, typically a floating diffusion region. The sensing node 210 is electrically connected to the gate 240 of an output source follower transistor. The source follower transistor 240 provides an output signal to a row select access transistor having gate 270 for selectively gating the output signal to terminal 32'. A reset transistor having gate 250 resets the sensing node 210 to a predetermined voltage before charge is transferred thereto from the charge collection region 230.

As FIG. 3A illustrates, an LDD block mask 299 can be used to form portions of the sensing node, e.g., floating diffusion region 210. Further, LDD block mask 299 can be used to form other LDD implanted regions of pixel cell 200. It should be appreciated that although FIG. 3A illustrates a 4T pixel cell with LDD block mask 299, LDD block mask 299 can also be used in forming a 3T pixel cell. The major difference arising through the omission of transfer transistor having gate 260 from a 3T pixel cell. For instance, LDD block mask 299 can be applied to the structures illustrated in FIGS. 4 and 5 to form LDD implanted regions if desired.

After all substrate doping is completed, an insulating layer 275 of borophosphorosilicate glass (BPSG), phososilicate glass (PSG), borosilicate glass (BSG), undoped $SiO_2$ or the like is deposited over the substrate p− region 206 and preferably planarized by CMP or other methods well-known in the art. A resist and mask (not shown) is applied to the insulating layer 275 and the resist is developed and the insulating layer 275 is etched to create contact opening 257. The insulating layer 275 may be etched by a selective wet etch or a selective dry etch to form contact opening 257. Metal conductor 215 is then formed within contact opening 257.

In a preferred method for forming the 4T embodiment, the invention provides a similar floating diffusion region 210 with a n-type implantation dose within the range from about $1 \times 10^{12}/cm^2$ to about $2 \times 10^{14}/cm^2$ such that a n− region is formed as the source and drain region between a transfer transistor gate 260 and a reset transistor gate 250. This n− region 212 is formed similar to the methods provided above. A mask (not illustrated) is applied to the substrate and developed such that the lightly-doped 212 region is formed between the reset 250 and transfer 260 transistors. Region 212 then diffuses outwards to form a common source/drain for the reset 250 and transfer 260 transistors.

However, the upper portion 213 of the floating diffusion region 210 is not subsequently doped after forming floating diffusion region 210. In this embodiment, only after contact opening 257 is formed using techniques as provided above, is the upper portion 213 of the floating diffusion region 210 further doped to a slightly higher n– doping concentration using a dose within the range from about $4\times10^{12}/cm^2$ to about $1\times10^{14}/cm^2$. In this embodiment, the second impurity concentration is added to the first impurity concentration region 212, after forming contact 257, to form a more heavily-doped upper portion 213 of floating diffusion region 210. After the doping of floating diffusion region 210 is completed, metal conductor 215 is then formed within contact opening 257. Again, the upper portion 213 is implanted with an implant energy from about 1 KeV to about 80 KeV, and preferably with an implant energy from about 4 KeV to about 50 KeV.

Accordingly, the invention provides a floating diffusion region 210 that is resistant to charge leakage for a CMOS pixel, with a lightly-doped n– region 212 for collecting transferred charge from region 235 of the photodiode and a more heavily n– doped surface region 213 for making a good contact with a metal conductor 215, formed in opening 257 which provides the collected charge to the gate of a source follower transistor 240. As noted, the charge collection region 212 may have a n– doping concentration in the range from about $1\times10^{12}/cm^2$ to about $2\times10^{14}/cm^2$, while the more heavily-doped n– shallow contact region 213 may have a n– doping concentration in the range from about $4\times10^{12}/cm^2$ to about $1\times10^{14}/cm^2$ that is implanted with an implant energy from about 1 KeV to about 80 KeV, and preferably with an implant energy from about 4 KeV to about 50 KeV.

After the processing sequences to produce the floating diffusion region 210 illustrated in FIG. 3, the CMOS imager pixel 200 is then processed according to known methods to produce an operative pixel.

It should be understood that while FIG. 3 includes a photodiode 230 as the photocollection device, other photocollection devices may also be used. For instance, rather than photodiode 230, photosensors such as a photogate or a photoconductor may also be employed with equal utility.

Figure 4:
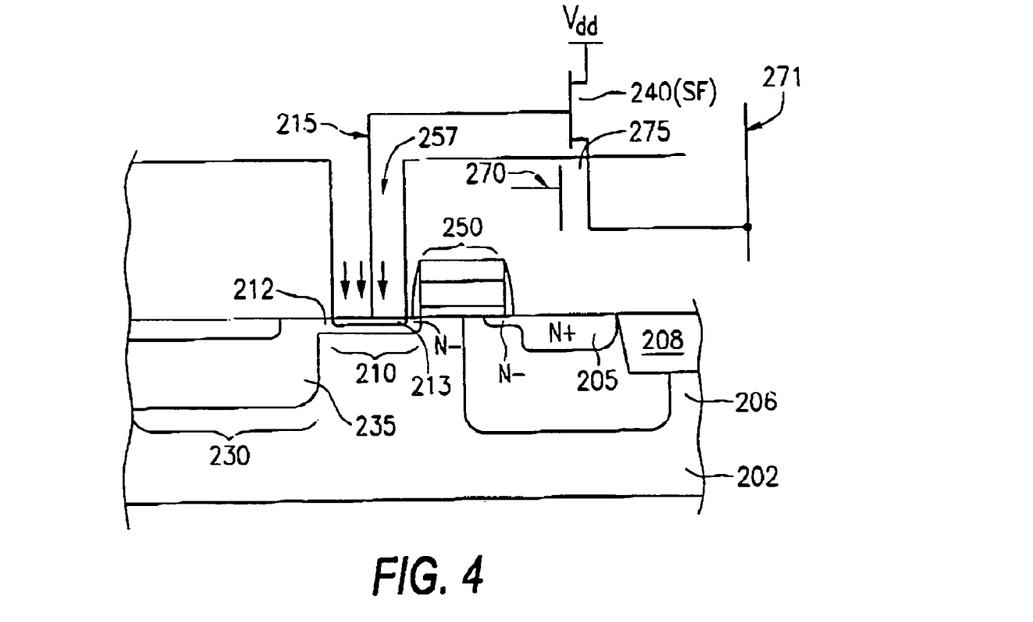
FIG. 4 is a diagrammatic side sectional view of a CMOS image sensor pixel formed in accordance with a second embodiment of the present invention.
Figure 5:
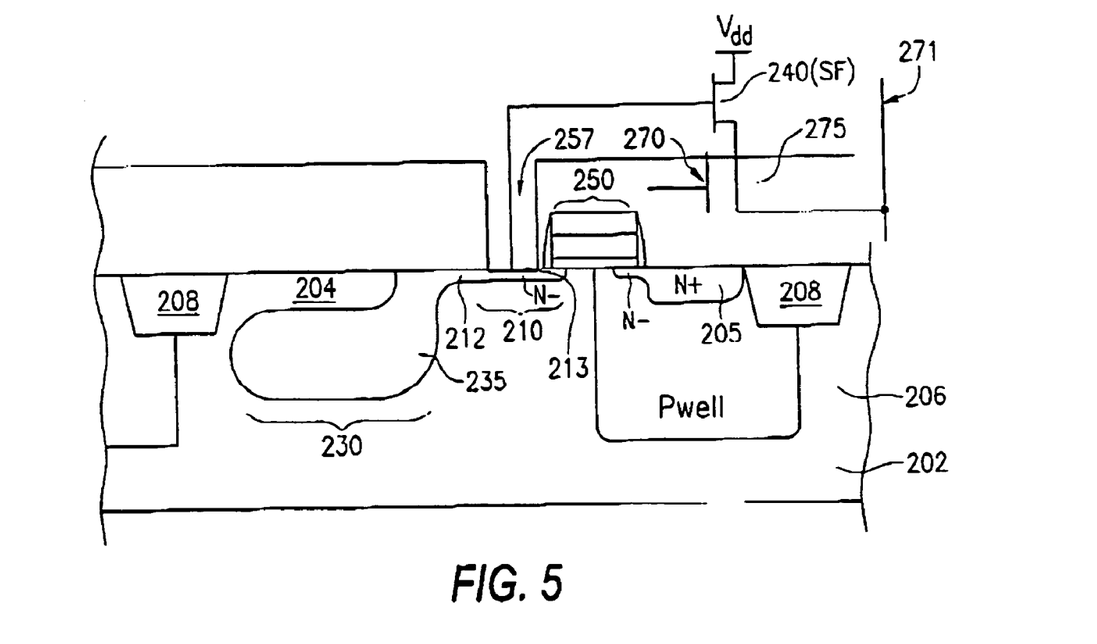
FIG. 5 is a diagrammatic side sectional view of a CMOS image sensor pixel at FIG. 4 at a subsequent processing step.

The embodiment of the invention depicted in FIGS. 2-3A relates to a 4T pixel which utilizes a transfer transistor 260 having a gate 261 for gating charge from the photodiode 230 to the floating diffusion region 210. Reference is now made to FIGS. 4-5 which illustrate another exemplary embodiment of the present invention in a 3T pixel.

In the 3T embodiment of FIGS. 4 and 5, the charge collection region 235 of the photodiode 230 is connected with the lightly-doped region 212 and the transfer transistor is omitted. Otherwise, the structure shown in FIGS. 4 and 5 is the same as in FIGS. 2 and 3. Particularly, region 212 is a lightly-doped n– region having an n– doping concentration within the range from about $1\times10^{12}/cm^2$ to about $2\times10^{14}/cm^2$ that can be formed with a LDD block mask 299 as FIG. 3A previously illustrated.

Referring now to FIG. 5, the lightly-doped n– region 212 is further n– implanted with a shallow n-type implant to create shallow contact region 213, for instance, with a directed or blanket phosphorus implant through opening 257, as in the FIGS. 2 and 3 embodiment.

As a result, the phosphorus implant creates a shallow doped n-type contact region 213 which is more heavily n– doped than region 212 to provide good ohmic contact with a metal conductor 215 formed in opening 257 as in the first embodiment. Thus, shallow contact region 213 (i.e., a second impurity concentration region) is more heavily n– doped than region 212 (i.e., a first impurity concentration region), but is not as heavily-doped as n+ source and drain region 205, for example, of the reset transistor 250 (i.e., a third impurity concentration region) or source follower transistor 240, or other transistors associated with the pixel.

As in the other embodiments, region 213 has a n– doping concentration within the range of about $4\times10^{12}/cm^2$ to about $1\times10^{14}/cm^2$ and is implanted with an implant energy from about 1 KeV to about 80 KeV, and preferably with an implant energy from about 4 KeV to about 50 KeV. After the processing to produce the floating diffusion region 210 illustrated in FIG. 5, the CMOS imager pixel cell is then processed according to known methods to produce an operative imaging pixel.

FIG. 4 illustrates etching BPSG layer 275 to form an opening 257 to the previously formed lightly-doped region 212. Metal conductor 215 is then formed within contact opening 257.

However, in a preferred method of the 3T embodiment, the invention provides a similar floating diffusion region 210 with a n-type implantation dose within the range from about $1\times10^{12}/cm^2$ to about $2\times10^{14}/cm^2$ such that the charge collection region 235 of the photodiode 230 is connected with the lightly-doped region 212. as FIG. 4 illustrates.

Here, the upper portion 213 of the floating diffusion region 210 is not subsequently doped after forming floating diffusion region 210. In this embodiment, only after contact opening 257 is formed using techniques as provided above, is the upper portion 213 of the floating diffusion region 210 further doped to a slightly higher n– doping concentration using a dose within the range from about $4\times10^{12}/cm^2$ to about $1\times10^{14}/cm^2$ and is implanted with an implant energy from about 1 KeV to about 80 KeV, and preferably with an implant energy from about 4 KeV to about 50 KeV. In this embodiment, the second impurity concentration is added to the first impurity concentration region 212, after forming contact 257, to form a more heavily-doped upper portion 213 of floating diffusion region 210. After the doping of floating diffusion region 210 is completed, metal conductor 215 is then formed within contact opening 257.

Figure 6:
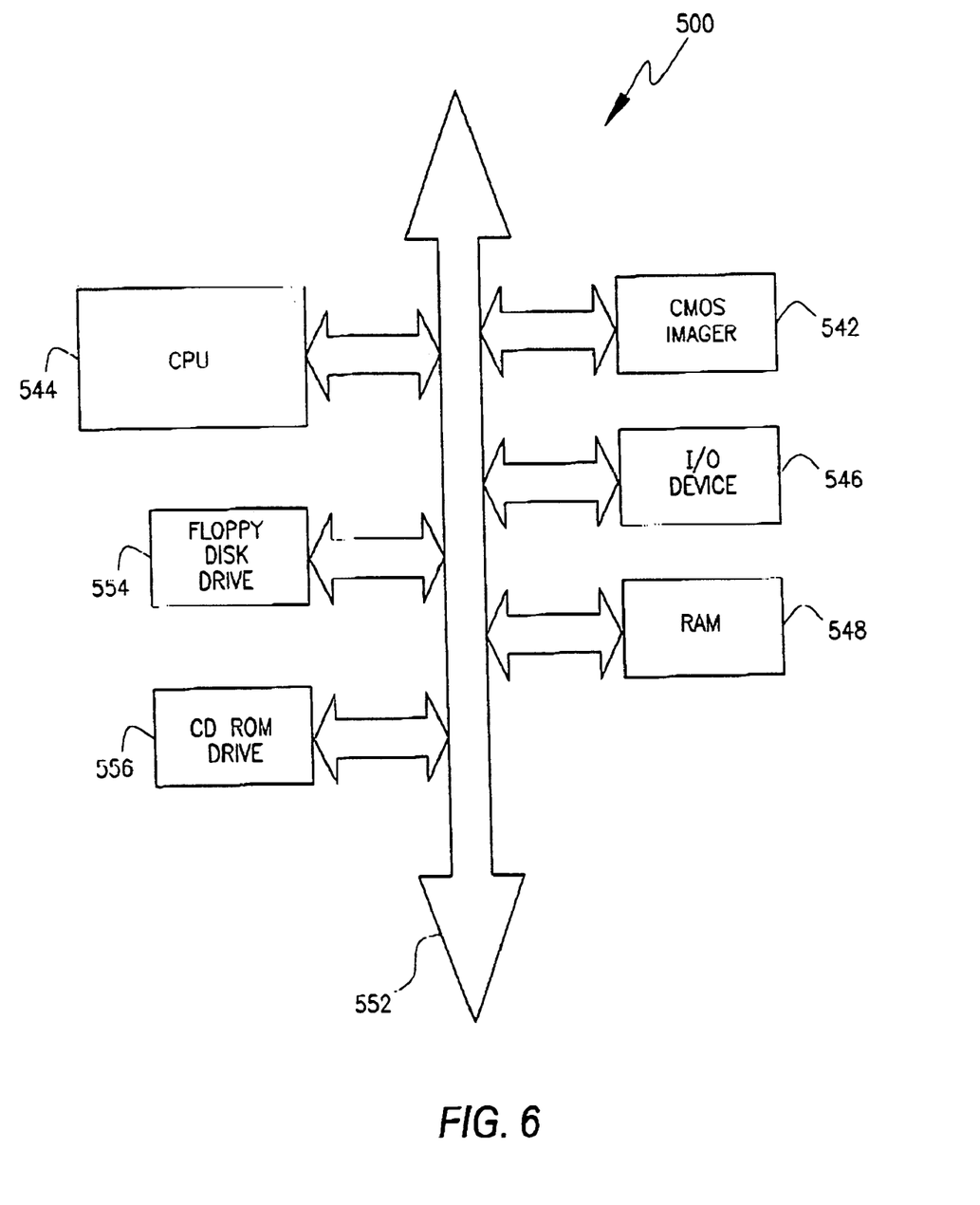
FIG. 6 illustrates a CMOS imager containing the invention with a processing system.

A typical processor based system which includes a CMOS imager device 542 having a pixel array in which the pixels are constructed according to the present invention is illustrated generally at 500 in FIG. 6. The imager device produces an output image from signals supplied from the pixel array. A processor based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager device 542 also communicates with the system over bus 552 or other communication link. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. It may also be desirable to integrate the processor 554, CMOS imager device 542 and memory 548 on a single IC chip.

The invention has been described with reference to pixels employing n– channel transistors. However, it should be understood that the invention is not so limited and may be employed in pixels have p– channel devices formed within an n-type substrate.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. An imager pixel comprising:
    a photoconversion device for generating charges;
    a diffusion node, said diffusion node having a first doped conductivity region formed by a first dose of impurity concentration of a first conductivity type, said first doped conductivity region configured to receive generated charges from said photoconversion device;
    a second doped conductivity region within said first conductivity region formed by a second dose of impurity concentration of said first conductivity type, said second conductivity region having a higher concentration of dopants than said first conductivity region; and
    a transistor used to operate said pixel, said transistor having a source/drain region of said first conductivity type, at least a portion of said source/drain region having a higher concentration of dopants than said second conductivity region.

2. A pixel as in claim 1, wherein said first dose of impurity concentration is in a range from about $1 \times 10^{12}/cm^2$ to about $2 \times 10^{14}/cm^2$.

3. A pixel as in claim 1, wherein said second dose of impurity concentration is in a range from about $4 \times 10^{12}/cm^2$ to about $1 \times 10^{14}/cm^2$.

4. A pixel as in claim 1, wherein said second conductivity region is provided at an upper portion of said first conductivity region.

5. A pixel as in claim 1, wherein said imager pixel is a part of a CMOS image device.

6. A pixel as in claim 1, wherein said photoconversion device is a photodiode.

7. A pixel as in claim 1, wherein said photoconversion device is a photoconductor.

8. A pixel as in claim 1, wherein said second impurity concentration results from being implanted at an implant energy from about 1 KeV to about 80 KeV.

9. A pixel as in claim 1, wherein said second impurity concentration results from being implanted at an implant energy from about 4 KeV to about 50 KeV.

10. A pixel as in claim 1, wherein said conductivity regions are n-type.

11. A pixel as in claim 1, wherein said conductivity regions are p-type.

12. A pixel as in claim 1, further comprising a conductor in contact with said second conductivity region.

13. A pixel as in claim 1, wherein a second portion of said source/drain region extends beneath a gate of said transistor, said second portion of said source/drain region having an impurity concentration that is substantially the same as an impurity concentration of said first doped conductivity region.

14. A pixel as in claim 1, wherein said at least a portion of said source/drain region is an n+ region and said first and second doped conductivity regions are n– regions.

15. A pixel as in claim 1, wherein said transistor is a reset transistor.

16. A pixel as in claim 15, wherein a second portion of said source/drain region has an impurity concentration that is substantially the same as an impurity concentration of said first doped conductivity region.

17. A pixel as in claim 15, further comprising a transfer transistor.

18. A pixel as in claim 17, wherein said diffusion node is between said transfer and reset transistor.

19. A pixel as in claim 18, wherein said transfer and reset transistor share a common source or drain region having a same impurity concentration as an impurity concentration of said first doped conductivity region.

20. A pixel as in claim 1, wherein said transistor is a row select transistor.

21. A pixel as in claim 1, wherein said transistor is a source follower transistor.

22. An imager pixel comprising:
    an active layer of a first conductivity type formed in a substrate;
    a transfer region formed in said active layer;
    a photosensor formed in said active layer adjacent said transfer region, said photosensor including a region of a second conductivity type between regions of said active layer of said first conductivity type;
    a charge collection region of said second conductivity type in said active layer, said charge collection region having a first doped conductivity region configured to receive charges transferred from said photosensor second conductivity region through said transfer region, said first doped conductivity region formed by a first dose of impurity concentration of said second conductivity type adjacent said active layer and a second doped conductivity region having a higher concentration of dopants than said first conductivity region and within said first conductivity region, formed by a second dose of impurity concentration of said second conductivity type, forming a conductor contact region at an upper portion of said charge collection region; and
    a transistor electrically coupled to said charge collection region, said transistor having a source/drain region of said second conductivity type, at least a portion of said source/drain region having a higher concentration of dopants than said second conductivity region.

23. A pixel as in claim 22, wherein said first dose of impurity concentration is in a range from about $1 \times 10^{12}/cm^2$ to about $2 \times 10^{14}/cm^2$.

24. A pixel as in claim 22, and said second dose of impurity concentration is in a range from about $4 \times 10^{12}/cm^2$ to about $1 \times 10^{14}/cm^2$.

25. A pixel as in claim 22, wherein said second conductivity type is a n-type conductivity.

26. A pixel as in claim 22, wherein said photosensor is a photodiode.

27. A pixel as in claim 22, wherein said photosensor is a photoconductor.

28. A pixel as in claim 22, wherein a second portion of said source/drain region has an impurity concentration that is substantially the same as an impurity concentration of said first doped conductivity region.

29. A pixel as in claim 22, wherein said at least a portion of said source/drain region is an n+ region and said first and second doped conductivity regions are n− regions.

30. A pixel as in claim 22, wherein said transistor is a reset transistor.

31. A pixel as in claim 30, further comprising a transfer transistor.

32. A pixel as in claim 31, wherein said diffusion node is a shared common source or drain of said reset and transfer transistor.

33. A processing system comprising: (i) a processor; and (ii) an imaging device coupled to said processor, said imaging device comprising at least one pixel, said pixel comprising:
a photoconversion device for generating charges;
a diffusion node, said diffusion node having a first doped conductivity region formed by a first dose of impurity concentration of a first conductivity type, said first doped conductivity region configured to receive generated charges from said photoconversion device;
a second doped conductivity region within said first conductivity region formed by a second dose of impurity concentration of said first conductivity type, said second conductivity region having a higher concentration of dopants than said first conductivity region; and
a transistor used to operate said pixel, said transistor having a source/drain region of said first conductivity type, at least a portion of said source/drain region having a higher concentration of dopants than said second conductivity region.

34. A system as in claim 33, wherein said first dose of impurity concentration is in a range from about $1 \times 10^{12}/cm^2$ to about $2 \times 10^{14}/cm^2$.

35. A system as in claim 33, wherein said second dose of impurity concentration is in a range from about $4 \times 10^{12}/cm^2$ to about $1 \times 10^{14}/cm^2$.

36. A system as in claim 33, wherein said second conductivity region is provided at an upper portion of said first conductivity region.

37. A system as in claim 33, wherein said photoconversion device is a photodiode.

38. A system as in claim 33, further comprising a conductor in contact with said second conductivity region.

39. A processing system as in claim 33, wherein a second portion of said source/drain region has an impurity concentration that is substantially the same as an impurity concentration of said first doped conductivity region.

40. A processing system as in claim 33, wherein said at least a portion of said source/drain region is an n+ region and said first and second doped conductivity regions are n− regions.

41. A processing system as in claim 33, wherein said transistor is a reset transistor.

42. A processing system as in claim 33, wherein said transistor is a transfer transistor.

43. An imager pixel comprising:
a photoconversion device for generating charges;
a transfer transistor electrically coupled to said photoconversion device;
a reset transistor having a source/drain region, at least a portion of said source/drain region being a n+ region;
a floating diffusion region having a first n− region, said first n− region being a common source and drain region between said transfer and reset transistor, said first n− region configured to receive generated charges from said photoconversion device; and
a second n− region of said floating diffusion region, said second n− region being located at an upper portion of said first n− region and having a higher concentration of dopants than said first n− region.

44. The imager pixel of claim 43, further comprising a second portion of said source/drain region of said reset transistor, wherein said second portion is a n− region.

45. The imager pixel of claim 44, wherein a dopant concentration of said first n− region and a dopant concentration of said second portion of said source/drain region substantially the same.

46. An imager pixel comprising:
a photoconversion device for generating charges;
a floating diffusion region electrically coupled to said reset transistor, said floating diffusion region having a first n− region configured to receive generated charges from said photoconversion device;
a second n− region of said floating diffusion region, said second n− region at an upper portion of said first n− region and having a higher concentration of dopants than said first n− region; and
a reset transistor having a source/drain region, at least a portion of said source/drain region being a n+ region, said n+ region having a higher concentration of dopants than said first and second n− region.

* * * * *